US012261260B2

(12) United States Patent
Shimizu et al.

(10) Patent No.: US 12,261,260 B2
(45) Date of Patent: Mar. 25, 2025

(54) MICRO-LED BOARD AND DISPLAY DEVICE

(71) Applicant: KYOCERA Corporation, Kyoto (JP)

(72) Inventors: Takashi Shimizu, Kusatsu (JP); Hiroaki Ito, Ritto (JP)

(73) Assignee: KYOCERA Corporation, Kyoto (JP)

( * ) Notice: Subject to any disclaimer, the term of this patent is extended or adjusted under 35 U.S.C. 154(b) by 509 days.

(21) Appl. No.: 17/603,554

(22) PCT Filed: Apr. 6, 2020

(86) PCT No.: PCT/JP2020/015562
§ 371 (c)(1),
(2) Date: Oct. 13, 2021

(87) PCT Pub. No.: WO2020/217959
PCT Pub. Date: Oct. 29, 2020

(65) Prior Publication Data
US 2022/0199879 A1 Jun. 23, 2022

(30) Foreign Application Priority Data
Apr. 23, 2019 (JP) ................................. 2019-081690

(51) Int. Cl.
*H01L 33/62* (2010.01)
*H01L 27/15* (2006.01)
*H01L 33/10* (2010.01)

(52) U.S. Cl.
CPC ............ *H01L 33/62* (2013.01); *H01L 27/156* (2013.01); *H01L 33/10* (2013.01)

(58) Field of Classification Search
CPC ..... H01L 25/0753; H01L 33/62; H01L 33/10; H01L 27/156; B29C 64/277; G09F 9/33; G09F 9/301; G09F 9/335
See application file for complete search history.

(56) References Cited

U.S. PATENT DOCUMENTS

| 8,853,696 | B1 | 10/2014 | Yamazaki et al. | |
|---|---|---|---|---|
| 2003/0146695 | A1* | 8/2003 | Seki | H10K 50/865 313/506 |
| 2006/0049476 | A1* | 3/2006 | Koizumi | H01L 27/14621 257/432 |
| 2012/0256814 | A1 | 10/2012 | Ootorii | |
| 2014/0361682 | A1* | 12/2014 | Cho | H05B 33/02 313/509 |

(Continued)

FOREIGN PATENT DOCUMENTS

| JP | 2001-041622 A | 2/2001 |
|---|---|---|
| JP | 2001051622 A | 2/2001 |

(Continued)

*Primary Examiner* — Moazzam Hossain
(74) *Attorney, Agent, or Firm* — Procopio, Cory, Hargreaves & Savitch LLP

(57) ABSTRACT

A micro-LED board includes a substrate, wiring, a first insulating layer, a micro-LED, and a light-blocking layer. The wiring, the first insulating layer, and the micro-LED are located on the substrate in an order of the wiring, the first insulating layer, and the micro-LED. The micro-LED overlaps the wiring. The light-blocking layer is located between the first insulating layer and the micro-LED, at least partially crosses a portion of the wiring directly below the micro-LED, and has an area that does not overlap a positive electrode and a negative electrode.

13 Claims, 8 Drawing Sheets

(56) References Cited

U.S. PATENT DOCUMENTS

| | | | |
|---|---|---|---|
| 2016/0365523 A1 | 12/2016 | Nishinohara et al. | |
| 2017/0012093 A1 | 1/2017 | Ono et al. | |
| 2017/0141349 A1 | 5/2017 | Kwak | |
| 2019/0259310 A1* | 8/2019 | Ha | H10K 77/111 |
| 2021/0327865 A1* | 10/2021 | Yamazaki | G09F 9/00 |
| 2021/0351238 A1* | 11/2021 | Park | H10K 59/00 |

FOREIGN PATENT DOCUMENTS

| | | |
|---|---|---|
| JP | 2012-227514 A | 11/2012 |
| JP | 2017-004838 A | 1/2017 |
| JP | 2019-046931 A | 3/2019 |
| JP | 2019-46931 A | 3/2019 |
| WO | 2015/114721 A1 | 8/2015 |

* cited by examiner

MICRO-LED BOARD AND DISPLAY DEVICE

FIELD

The present disclosure relates to a micro-light-emitting diode (LED) board including micro-LEDs and to a display device including the micro-LED board.

BACKGROUND

A known technique is described in, for example, Patent Literature 1.

CITATION LIST

Patent Literature

Patent Literature 1: Re-publication of PCT International Publication No. WO 2015-114721

BRIEF SUMMARY

A micro-light-emitting diode (LED) board according to an aspect of the present disclosure includes a substrate, wiring, a first insulating layer, a micro-LED, and a light-blocking layer. The wiring, the first insulating layer, and the micro-LED are located on the substrate in an order of the wiring, the first insulating layer, and the micro-LED. The micro-LED overlaps the wiring and includes a positive electrode and a negative electrode spaced from each other in a plan view. The light-blocking layer is located between the first insulating layer and the micro-LED, at least partially crosses a portion of the wiring directly below the micro-LED, and has an area that does not overlap the positive electrode and the negative electrode.

A display device according to another aspect of the present disclosure includes the micro-LED board according to the above aspect of the present disclosure. The micro-LED board has a mount surface, an opposite surface opposite to the mount surface, and a side surface, the mount surface receiving a plurality of pixel units, each pixel unit of the plurality of pixel units including the micro-LED. The micro-LED board includes side wiring on the side surface, and a driver on the opposite surface. The plurality of pixel units are arranged in a matrix. The micro-LED of each pixel unit is connected to the driver with the side wiring.

BRIEF DESCRIPTION OF DRAWINGS

The objects, features, and advantages of the present disclosure will become more apparent from the following detailed description and the drawings.

DETAILED DESCRIPTION

A micro-light-emitting diode (LED) board and a display device according to one or more embodiments of the present disclosure will now be described with reference to the drawings. Each figure referred to below shows main components and other elements of the micro-LED board and the display device according to the embodiments. The micro-LED board and the display device according to the embodiments may thus include known components not shown in the figures, such as circuit boards, wiring conductors, control integrated circuits (ICs), and large-scale integration (LSI) circuits.

A display device with the structure that forms the basis of a display device according to one or more embodiments of the present disclosure will be described first with reference to FIGS. 6A to 9B.

A known backlight-free, self-luminous display device with the structure that forms the basis of the display device according to one or more embodiments of the present disclosure includes a micro-LED board including LEDs.

Figure 6A:
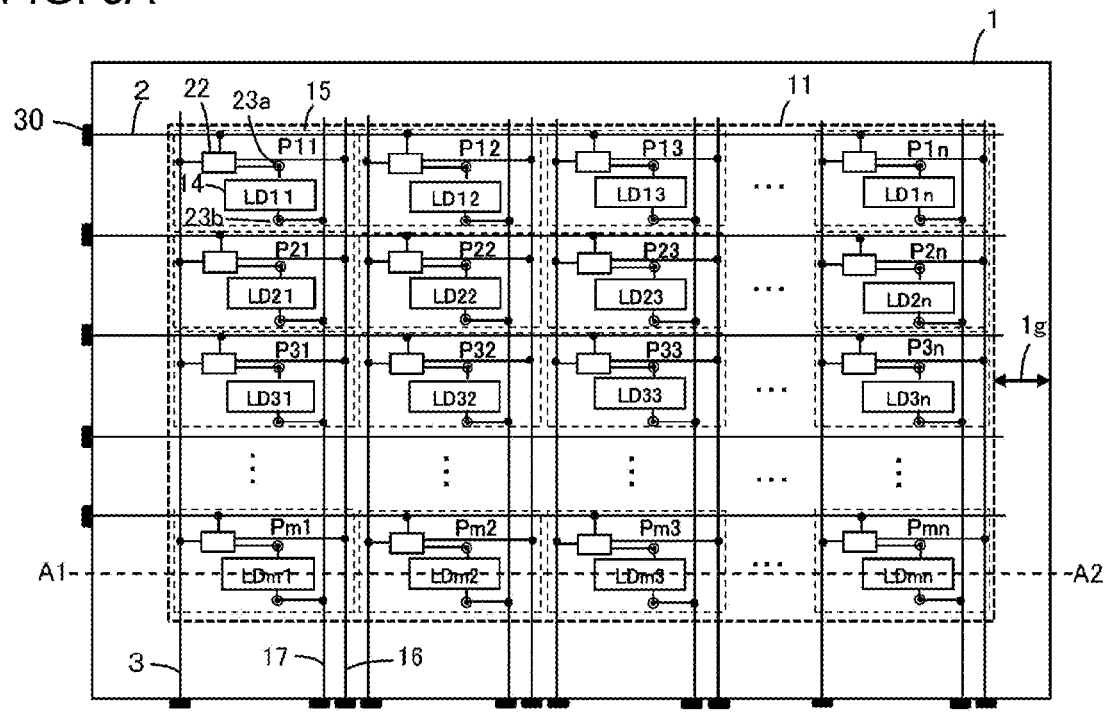
FIG. 6A is a block circuit diagram of a basic structure of a display device with the structure that forms the basis of the display device according to one or more embodiments of the present disclosure.
Figure 6B:
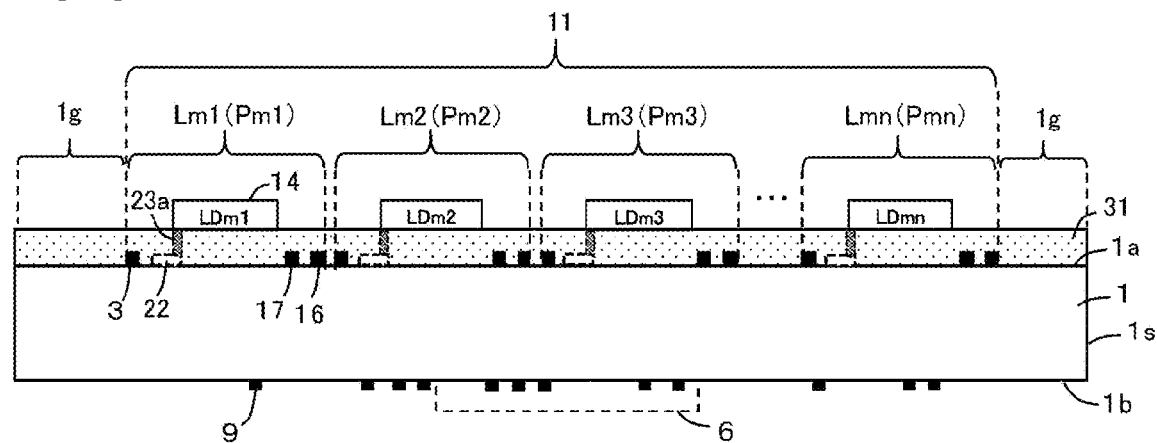
FIG. 6B is a cross-sectional view of the display device with the structure that forms the basis of the display device according to one or more embodiments of the present disclosure, taken along line A1-A2 in FIG. 6A.

FIG. 6A is a block circuit diagram of the basic structure of such a display device. FIG. 6B is a cross-sectional view taken along line A1-A2 in FIG. 6A. The display device includes a substrate 1 such as a glass substrate, scanning signal lines 2 extending in a predetermined direction (e.g., a row direction) on the substrate 1, emission control signal lines 3 crossing the scanning signal lines 2 and extending in a direction (e.g., a column direction) crossing the predetermined direction, an active area (pixel area) 11 including multiple pixel units (Pmn) 15 defined by the scanning signal lines 2 and the emission control signal lines 3, and multiple light emitters 14 located on an insulating layer. To minimize a frame 1g (shown in FIGS. 6A and 6B) surrounding the active area 11, the scanning signal lines 2 and the emission control signal lines 3 may be connected to back wiring 9 on the back surface of the substrate 1 with side wiring 30 (shown in FIG. 6A) on a side surface of the substrate 1. The back wiring 9 may be connected to a driver 6 including driving elements such as ICs and LSI circuits mounted on the back surface of the substrate 1. In this case, the display in the display device is driven and controlled by the driver 6 on the back surface of the substrate 1. The driver 6 are mounted on the back surface of the substrate 1 by, for example, chip on glass (COG).

Each pixel unit (Pmn) 15 includes an emission controller 22 to control, for example, the emission or non-emission state and the light intensity of the micro-LED (LDmn) 14 in an emissive area (Lmn). The emission controller 22 includes a thin-film transistor (TFT) 12 (shown in FIG. 7A) as a switch for inputting an emission signal into the micro-LED 14 and a TFT 13 (shown in FIG. 7A) as a driving element for driving the micro-LED 14 with a current using an electric potential difference (emission signal) between a positive voltage (anode voltage of about 3 to 5 V) and a negative voltage (cathode voltage of about −3 to 0 V) corresponding to the level (voltage) of an emission control signal (signal transmitted through the emission control signal lines 3). A connection line connecting a gate electrode and a source electrode of the TFT 13 receives a capacitor, which retains the voltage of the emission control signal input into the gate electrode of the TFT 13 until the subsequent rewriting is performed (for a period of one frame).

The micro-LED 14 is electrically connected to the emission controller 22, a positive voltage input line 16, and a negative voltage input line 17 with feedthrough conductors 23a and 23b (shown in FIG. 7A) such as through-holes formed through an insulating layer 31 (shown in FIG. 6B) located in the active area 11. In other words, the micro-LED 14 includes a positive electrode connected to the positive voltage input line 16 with a positive electrode pad located on the substrate 1, the feedthrough conductor 23a, and the micro-LED emission controller 22, and includes a negative electrode connected to the negative voltage input line 17 with a negative electrode pad located on the substrate 1 and the feedthrough conductor 23b.

The display device also includes the frame 1g (shown in FIG. 6A) between the active area 11 and the edge of the substrate 1 as viewed in plan. The frame 1g, which does not contribute to display, may receive an emission control signal line drive circuit, a scanning signal line drive circuit, and other components.

Figure 7A:
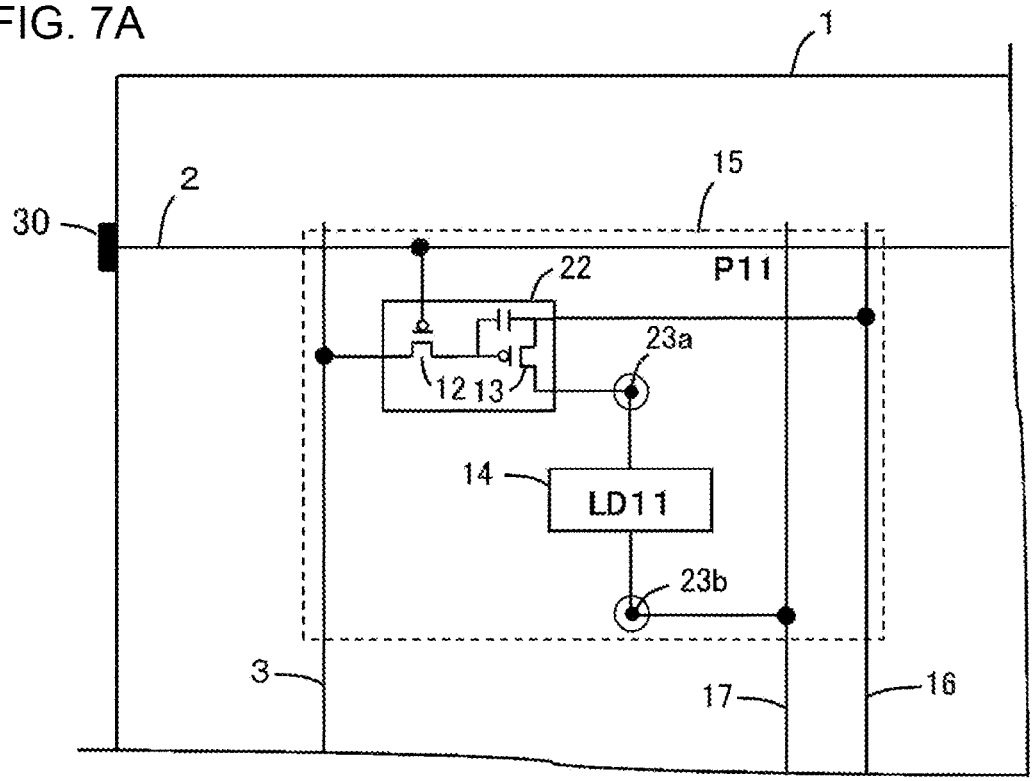
FIG. 7A is an enlarged plan view of a pixel unit in the display device shown in FIGS. 6A and 6B.
Figure 7B:
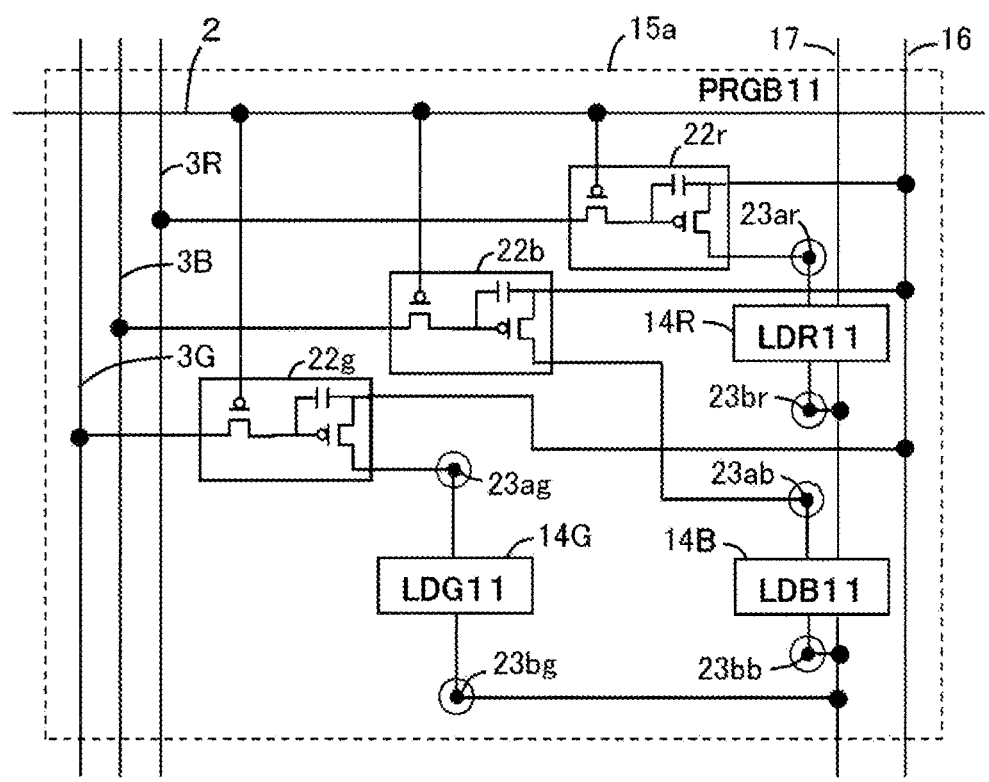
FIG. 7B is a circuit diagram of a pixel unit including micro-LEDs with three primary colors with a structure similar to the structure in FIG. 7A.

As shown in FIG. 7B, a pixel unit (PRGB11) 15a includes a red-light emissive red micro-LED (LDR11) 14R, a green-light emissive green micro-LED (LDG11) 14G, and a blue-light emissive blue micro-LED (LDB11) 14B. Many of the pixel units 15a arranged in a matrix can form a color display device. To form a high-definition and high-resolution display device by minimizing the size of each pixel unit 15a, emission controllers 22r, 22g, and 22b may be located below the red micro-LED 14R, the green micro-LED 14G, and the blue micro-LED 14B with an insulating layer between them. The positive voltage input line 16 and the negative voltage input line 17 may be located below, for example, the red micro-LED 14R with an insulating layer between them. At least either the positive voltage input line 16 or the negative voltage input line 17 may overlap, for example, the red micro-LED 14R as viewed in plan. In FIG. 7B, the negative voltage input line 17 overlaps the red micro-LED 14R and the blue micro-LED 14B as viewed in plan. In other wiring structures, wiring forming the emission controllers 22r, 22g, and 22b, or wiring connecting, for example, the red micro-LED 14R to the emission controller 22r may overlap the red micro-LED 14R.

In FIG. 7B, an emission control signal line 3R controls the light intensity of the red micro-LED 14R, an emission control signal line 3G controls the light intensity of the green micro-LED 14G, and an emission control signal line 3B controls the light intensity of the blue micro-LED 14B. The red micro-LED 14R is electrically connected to the emission controller 22r, the positive voltage input line 16, and the negative voltage input line 17 with feedthrough conductors 23ar and 23br. The green micro-LED 14G is electrically connected to the emission controller 22g, the positive voltage input line 16, and the negative voltage input line 17 with feedthrough conductor 23ag and 23bg. The blue micro-LED 14B is electrically connected to the emission controller 22b, the positive voltage input line 16, and the negative voltage input line 17 with feedthrough conductors 23ab and 23bb.

Figure 8A:
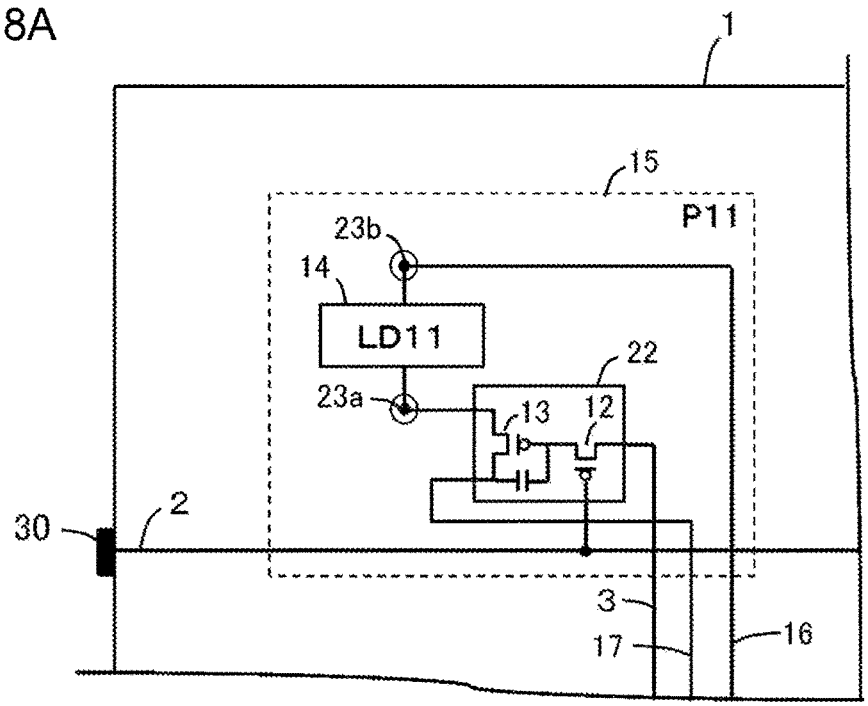
FIG. 8A is an enlarged plan view of a pixel unit in a display device with another structure that forms the basis of the display device according to one or more embodiments of the present disclosure.
Figure 8B:
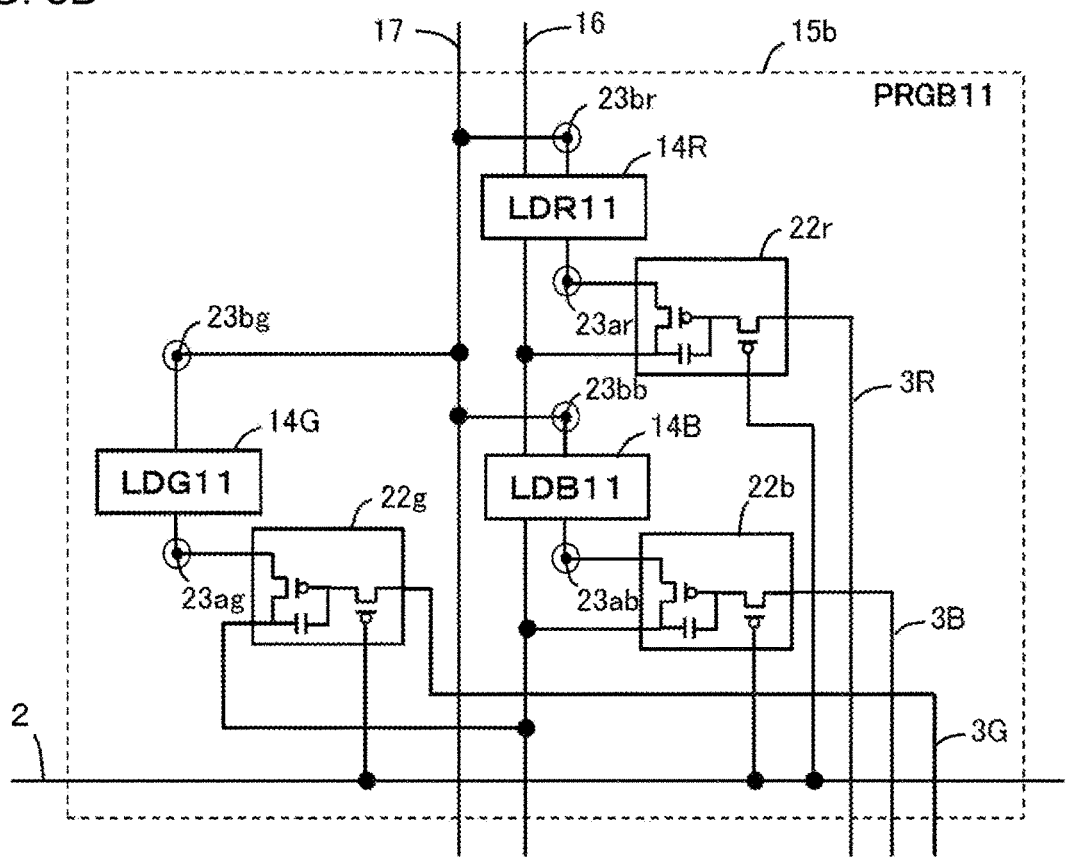
FIG. 8B is a circuit diagram of a pixel unit including micro-LEDs with three primary colors with a structure similar to the structure in FIG. 8A.

FIGS. 8A and 8B show the emission controllers 22 (22r, 22g, and 22b) located closer to the center of the substrate 1 than the micro-LEDs 14 (14R, 14G, and 14B). As shown in FIG. 8B, a pixel unit (PRGB11) 15b includes the red micro-LED 14R, the green micro-LED 14G, and the blue micro-LED 14B. Many pixel units 15b are arranged in a matrix to form a color display device. In this case, for the same purpose as for the display device in FIG. 7B, for example, the emission controllers 22r may be located below the red micro-LED 14R with an insulating layer between them. The positive voltage input line 16 and the negative voltage input line 17 may be located below, for example, the red micro-LED 14R with an insulating layer between them. At least either the positive voltage input line 16 or the negative voltage input line 17 may overlap, for example, the red micro-LED 14R as viewed in plan. In FIG. 8B, the positive voltage input line 16 overlaps the red micro-LED 14R and the blue micro-LED 14B as viewed in plan. In other wiring structures, wiring forming, for example, the emission controller 22r, or wiring connecting, for example, the red micro-LED 14R to the emission controller 22r may overlap the red micro-LED 14R.

Figure 9A:
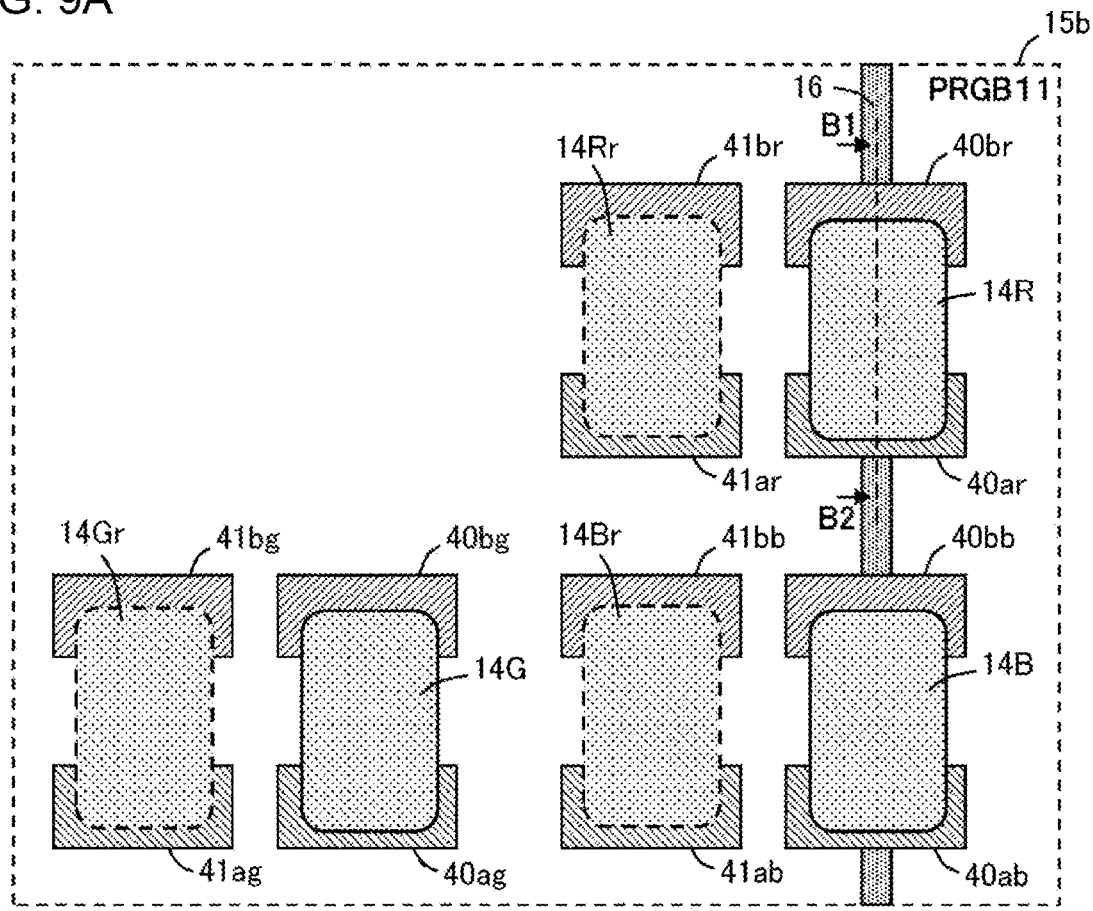
FIG. 9A is a plan view of the pixel unit in FIG. 8B, showing the structure of the pixel unit in detail.
Figure 9B:
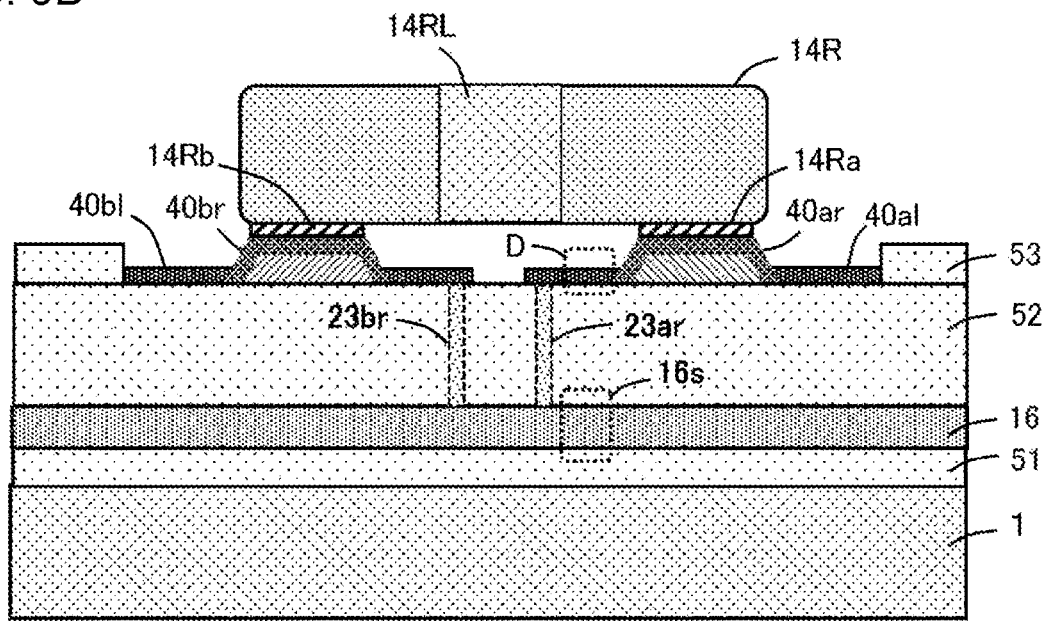
FIG. 9B is a cross-sectional view of the pixel unit in FIG. 8B taken along line B1-B2 in FIG. 9A as viewed in the direction indicated by arrows, showing the structure of the pixel unit in detail.

FIGS. 9A and 9B show the structure of the pixel unit 15b in FIG. 8B in detail. FIG. 9A is a plan view of the pixel unit 15b. FIG. 9B is a cross-sectional view taken along line B1-B2 in FIG. 9A. As shown in FIG. 9A, the red micro-LED 14R includes a positive electrode connected to a positive electrode pad 40ar located on the substrate 1 with a conductive connector such as solder and an anisotropic conductive film (ACF). The red micro-LED 14R includes a negative electrode connected to a negative electrode pad 40br located on the substrate 1 with the conductive connector. In this manner, the red micro-LED 14R is mounted on the substrate 1. A positive electrode pad 41ar and a negative electrode pad 41br are located adjacent to the red micro-LED 14R on the substrate 1 to receive a red micro-LED 14Rr that can replace the red micro-LED 14R when the red micro-LED 14R becomes defective. The green micro-LED 14G includes a positive electrode connected to a positive electrode pad 40ag located on the substrate 1 with the conductive connector. The green micro-LED 14G includes a negative electrode connected to a negative electrode pad 40bg located on the substrate 1 with the conductive connector. In this manner, the green micro-LED 14G is mounted on the substrate 1. A positive electrode pad 41ag and a negative electrode pad 41bg are located adjacent to the green micro-LED 14G on the substrate 1 to receive a green micro-LED 14Gr that can replace the green micro-LED 14G when the green micro-LED 14G becomes defective. The blue micro-LED 14B includes a positive electrode connected to a positive electrode pad 40ab located on the substrate 1 with the conductive connector. The blue micro-LED 14B includes a negative electrode connected to a negative electrode pad 40bb located on the substrate 1 with the conductive connector. In this manner, the blue micro-LED 14B is mounted on the substrate 1. A positive electrode pad 41ab and a negative electrode pad 41bb are located adjacent to the blue micro-LED 14B on the substrate 1 to receive a blue micro-LED 14Br that can replace the blue micro-LED 14B when blue micro-LED 14B becomes defective.

As shown in FIG. 9B, an insulating layer 51, the positive voltage input line 16, and insulating layers 52 and 53 are stacked on the substrate 1 in this order from the substrate 1. The insulating layers 51 to 53 are inorganic insulating layers including, for example, silicon dioxide ($SiO_2$) or silicon nitride ($Si_3N_4$), or organic insulating layers including, for example, acrylic resin or polycarbonate. The positive electrode pad 40ar and the negative electrode pad 40br are located in portions in an opening in the insulating layer 53 through which the insulating layer 52 is exposed (in a portion on the bottom surface of the opening). The positive electrode pad 40ar and the negative electrode pad 40br may be formed from metal layers including, for example, Mo/Al/Mo layers (indicating a stack of a Mo layer, an Al layer, and a Mo layer in this order), and translucent conductive layers including, for example, indium tin oxide (ITO) to cover each of the metal layers. The red micro-LED 14R includes a positive electrode 14Ra connected to the positive electrode pad 40ar and a negative electrode 14Rb connected to the negative electrode pad 40br.

An image display device with another structure that forms the basis of the display device according to one or more embodiments of the present disclosure includes a first pixel circuit including a drive transistor for driving an organic electroluminescence (EL) element located in a pixel unit. The drive transistor includes a gate electrode located on a substrate, a semiconductor layer located on the gate electrode with an insulating layer between them, and a pair of source-drain electrodes located on the semiconductor layer. The image display device also includes a second pixel circuit adjacent to the first pixel circuit, a pixel electrode located above the second pixel circuit and electrically connected to either of the pair of source-drain electrodes in the drive transistor in the first pixel circuit, and a top metal electrode electrically connected to either of the pair of source-drain electrodes, located below the pixel electrode, and covering entirely at least a channel region of the semiconductor layer from above (refer to, for example, Patent Literature 1).

Figure 1A:
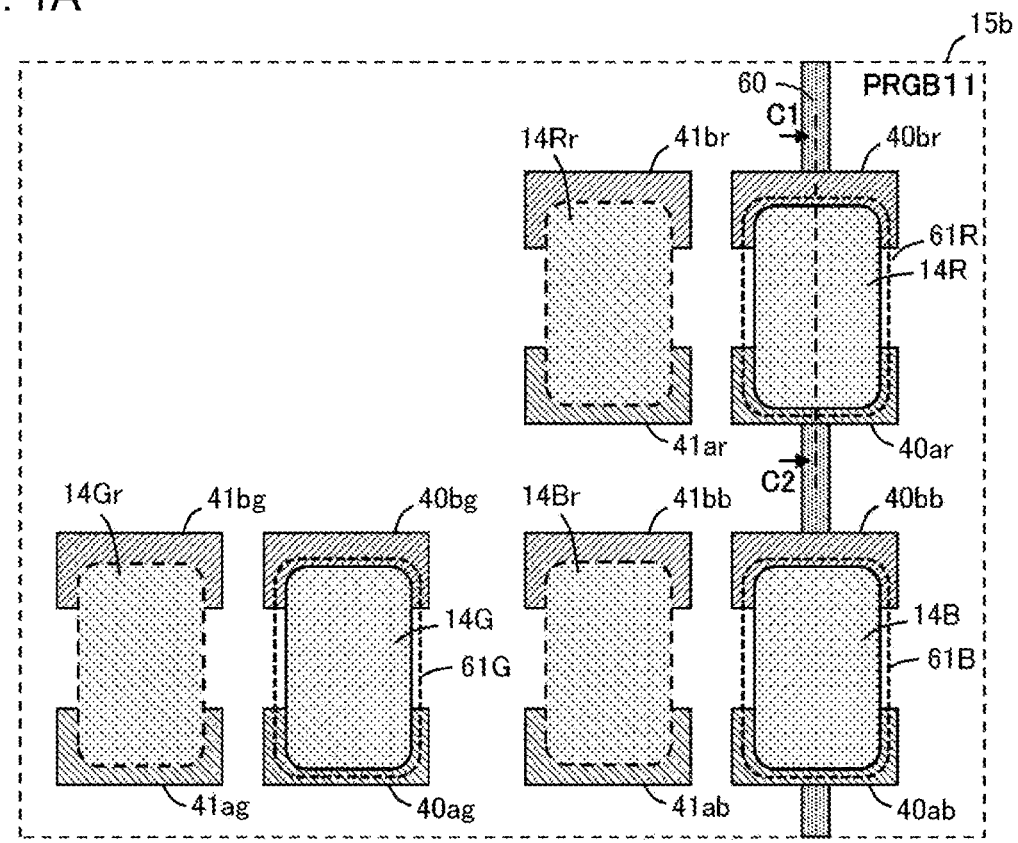
FIG. 1A is a plan view of a pixel unit including micro-LEDs with three primary colors in a micro-LED board according to an embodiment of the present disclosure.

FIGS. 1A to 5 show the micro-LED board according to one or more embodiments. As shown in FIGS. 1A and 1B, the micro-LED board includes wiring 60, a first insulating layer 52 as an insulating layer, and the micro-LED 14R located on the substrate 1 in this order from the substrate 1. The micro-LED 14R overlaps the wiring 60. The micro-LED board further includes a light-blocking layer 61 (61R) between the first insulating layer 52 and the micro-LED 14R. The light-blocking layer 61 (61R) crosses at least partially the wiring 60 located directly below the micro-LED 14R, and has an area that does not overlap the positive electrode 14Ra and the negative electrode 14Rb. The above structure produces the advantageous effects described below. When a micro-LED 14R has a connection fault or a defect and emits light with an unintended light intensity or fails to emit light, laser light LR is used to cut a connection wire 40al (for example, at its portion between the feedthrough conductor 23ar and the positive electrode pad 40ar as indicated by D in FIG. 1B) connectable to the positive electrode 14Ra and/or a connection wire 40bl (for example, at its portion between the feedthrough conductor 23br and the negative electrode pad 40br as indicated by E in FIG. 1B) connectable to the negative electrode 14Rb. This structure can prevent the laser light LR from reaching the wiring 60, and thus from accidentally breaking or cutting the wiring 60. This structure can also prevent separation at the interface between the wiring 60 and the first insulating layer 52 caused by heat from the laser light LR, which can cause a less flat outermost surface of the substrate 1.

The wiring 60 includes drive wiring or other wiring electrically connected to the positive voltage input line 16, the negative voltage input line 17, or the micro-LED 14R.

In the micro-LED board according to the present embodiment, the substrate 1 may be a translucent substrate such as a glass substrate and a plastic substrate, or a non-translucent substrate such as a ceramic substrate, a non-translucent plastic substrate, and a metal substrate. The substrate 1 may further be a composite substrate including a laminate of a glass substrate and a plastic substrate, a laminate of a glass substrate and a ceramic substrate, a laminate of a glass substrate and a metal substrate, or a laminate of at least any two of the above substrates formed from different materials. The substrate 1 including an electrically insulating substrate, such as a glass substrate, a plastic substrate, or a ceramic substrate, facilitates formation of wiring. The substrate 1 may be rectangular, circular, oval, trapezoidal, or in any other shape as viewed in plan.

Figure 1B:
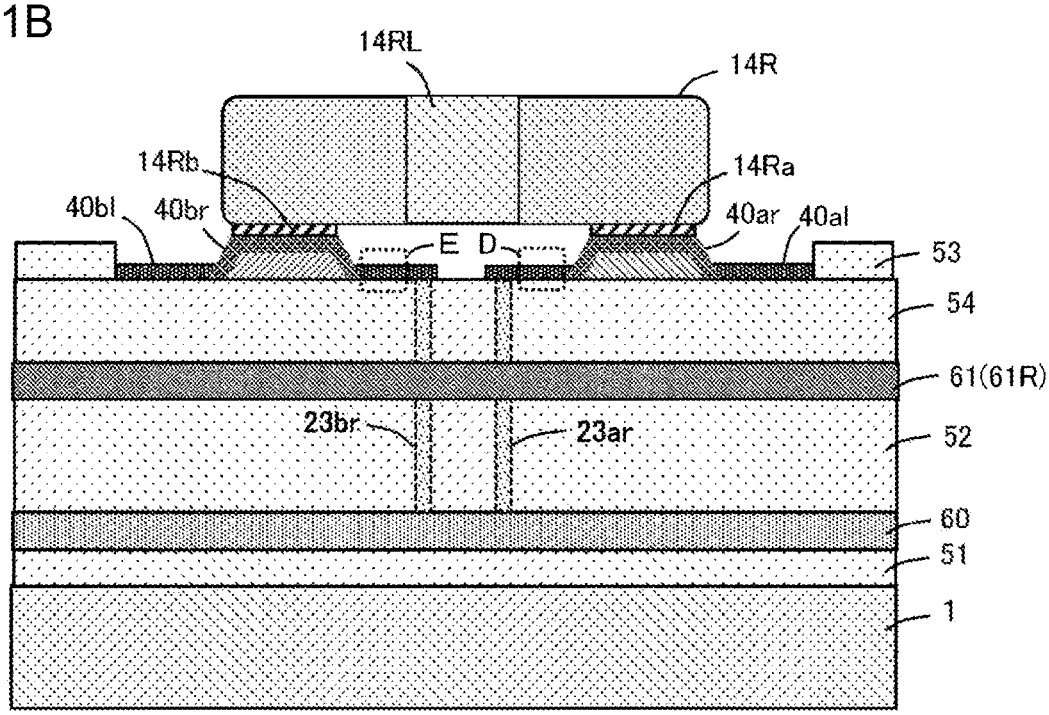
FIG. 1B is a cross-sectional view of the micro-LED board according to the embodiment of the present disclosure, taken along line C1-C2 in FIG. 1A as viewed in the direction indicated by arrows.

The micro-LEDs 14R used in the micro-LED board according to the present embodiment are backlight-free, self-luminous, and have high emission efficiency and a longer service life. As shown in FIG. 1B, the micro-LED 14R mounted laterally includes the positive electrode 14Ra and the negative electrode 14Rb located close to the substrate 1 and spaced from each other as viewed in plan. The laterally mounted micro-LED 14R includes a light-emitting portion 14RL at the center between the positive electrode 14Ra and the negative electrode 14Rb as viewed in plan. The positive electrode 14Ra is connected to the positive electrode pad 40ar located on the substrate 1 with a conductive connector such as solder. The negative electrode 14Rb is connected to the negative electrode pad 40br located on the substrate 1 with the conductive connector.

In some embodiments, the micro-LED 14R may be mounted vertically on (perpendicularly to) a mount surface 1a (shown in FIG. 6B) of the substrate 1. In this case, the mounted micro-LED 14R includes, for example, a positive electrode, an emissive layer, and a negative electrode stacked in this order from the mount surface 1a.

The micro-LED 14R rectangular as viewed in plan may have, but is not limited to, each side with a length of about 1 to 100 µm inclusive, or more specifically about 3 to 10 µm inclusive.

As shown in FIG. 1A, one pixel unit (PRGB11) 15b may include micro-LEDs 14R, 14G, and 14B for emitting light with different colors. For example, the micro-LED 14R may emit red, orange, red-orange, red-violet, or violet light. The micro-LED 14G may emit green or yellow-green light. The micro-LED 14B may emit blue light. The micro-LED board facilitates fabrication of a color display device. In some embodiments, one pixel unit 15b including three or more micro-LEDs 14 (hereafter, micro-LEDs such as the micro-LED 14R are correctively referred to as micro-LEDs 14) may include multiple same-color emissive micro-LEDs 14.

The micro-LED 14Rr is placed adjacent to the micro-LED 14R to be a replacement for the micro-LED 14R having an emission fault or an emission failure. The micro-LED 14Rr includes a positive electrode connectable to the positive electrode pad 41ar and a negative electrode connectable to the negative electrode pad 41br. Similarly, the micro-LED 14Gr is placed adjacent to the micro-LED 14G to be a replacement for the micro-LED 14G having an emission fault or an emission failure. The micro-LED 14Gr includes a positive electrode connectable to the positive electrode pad 41ag and a negative electrode connectable to the negative electrode pad 41bg. Similarly, the micro-LED 14Br is placed adjacent to the micro-LED 14B to be a replacement for the micro-LED 14B having an emission fault or an emission failure. The micro-LED 14Br includes a positive electrode connectable to the positive electrode pad 41ab and a negative electrode connectable to the negative electrode pad 41bb.

The wiring 60, the positive electrode 14Ra, and the negative electrode 14Rb are conductor layers including, for example, tantalum (Ta), tungsten (W), titanium (Ti), molybdenum (Mo), aluminum (Al), chromium (Cr), silver (Ag), or copper (Cu). The wiring 60, the positive electrode 14Ra, and the negative electrode 14Rb may be metal layers including Mo/Al/Mo layers (indicating a stack of a Mo layer, an Al layer, and a Mo layer in this order) or metal layer(s) including an Al layer, Al/Ti layers, Ti/Al/Ti layers, a Mo layer, Mo/Al/Mo layers, Ti/Al/Mo layers, Mo/Al/Ti layers, a Cu layer, a Cr layer, a Ni layer, or a Ag layer.

The positive electrode pad 40ar and the negative electrode pad 40br may have the same structure as the wiring 60, the positive electrode 14Ra, and the negative electrode 14Rb. In some embodiments, the positive electrode pad 40ar and the negative electrode pad 40br may be covered by translucent, conductive layers including a translucent, conductive material such as ITO, indium zinc oxide (IZO), silicon oxide-doped indium tin oxide (ITSO), zinc oxide (ZnO), and silicon (Si) containing phosphorus and boron.

The pixel unit 15b, including multiple micro-LEDs 14R, 14G, and 14B for emitting light with different colors, serves as a display unit. For example, a color display device includes pixel units each including a red-light emissive micro-LED 14R, a green-light emissive micro-LED 14G, and a blue-light emissive micro-LED 14B to enable display of color tones.

In some embodiments, the micro-LEDs 14R, 14G, and 14B included in one pixel unit 15b are not aligned on a single straight line as viewed in plan. In this case, the pixel unit 15b is smaller as viewed in plan, and may be compact and square as viewed in plan. The display device or other devices thus include pixels with higher density and less irregularities, thus enabling high-quality image display.

Each pixel unit 15b may include an emission controller including a TFT, serving as a switch or a control element for controlling the emission or non-emission state and the light intensity of the micro-LED 14R, 14G, and 14B. The emission controllers may be located below the micro-LED 14R, 14G, and 14B with an insulating layer between them. In this case, the pixel unit 15b is smaller as viewed in plan, and may be compact and square as viewed in plan. The display device or other devices thus include pixels with higher density and less irregularities, thus enabling high-quality image display.

In the micro-LED board according to the present embodiment, a light-blocking layer 61R may entirely cover the wiring 60 located directly below the micro-LED 14R. In this structure, the larger light-blocking layer 61R can more effectively prevent the laser light LR from reaching the wiring 60, and thus from accidentally breaking or cutting the wiring 60. This structure can also more effectively prevent separation at the interface between the wiring 60 and the first insulating layer 52 caused by heat from the laser light LR and causing a less flat outermost surface of the substrate 1.

As shown in FIG. 1A, the light-blocking layer 61R may cover the micro-LED 14R as viewed in plan, or in other words, may include the micro-LED 14R as viewed in plan. In this structure, the larger light-blocking layer 61R can more effectively prevent the laser light LR from reaching the wiring 60, and thus from accidentally breaking or cutting the wiring 60. This structure can also more effectively prevent separation at the interface between the wiring 60 and the first insulating layer 52 caused by heat from the laser light LR and causing a less flat outermost surface of the substrate 1.

A light-blocking layer 61G may be located below the micro-LED 14G. A light-blocking layer 61B may be located below the micro-LED 14B. The light-blocking layers 61G and 61B may be modified variously in the same manner as the light-blocking layer 61R.

In the micro-LED board according to the present embodiment, the light-blocking layer 61R may be black, blackish brown, dark blue, or may have other dark colors. The light-blocking layer 61R with such a dark color may be formed by mixing dark-colored pigments, dyes, ceramic particles, plastic particles, or metal particles into a resin layer formed from an organic resin such as acrylic resin or polycarbonate. The resin layer may contain 50% or greater by volume of pigments, ceramic particles, or metal particles to have high resistance particularly to high-power laser light such as yttrium aluminum garnet (YAG) laser light. The light-blocking layer 61R may be an inorganic insulating layer including, for example, $SiO_2$, or $Si_3N_4$, and containing 50% or greater by volume of pigments, ceramic particles, or metal particles.

The light-blocking layer 61R can be in such dark colors by forming at least its surface layer with, for example, a Cr layer, a carbon layer, or a layer containing carbon. For example, the light-blocking layer 61R may have a base layer formed from a metallic-colored conductor layer including, for example, Ta, W, Ti, Mo, Al, Ag, or Cu, and a surface layer, located on the base layer, formed from a Cr layer, a carbon layer, or a layer containing carbon.

The light-blocking layer 61R may include, for example, a metal layer including, for example, Ta, W, Ti, Mo, Al, Ag, or Cu. The light-blocking layer 61R may be a composite layer including multiple layers containing these materials. For example, the light-blocking layer 61R may include Mo/Al/Mo layers.

Such a conductive light-blocking layer 61R including the metal layers described above may be connected to a power line such as the positive voltage input line 16 and the negative voltage input line 17. The light-blocking layer 61R connected to the power line increases the area of the power line, thus stabilizing the power voltage. Such a conductive light-blocking layer 61R including the metal layers described above may be connected to either the positive voltage input line 16 or the negative voltage input line 17, which serves as a ground potential line (for example, the negative voltage input line 17). In this case, the ground potential is stabilized, and thus the power source potential is stabilized further. In some embodiments, the light-blocking layer 61R may be electrically floating without being connected to any power line.

The light-blocking layer 61R may have a thickness of about 100 to 1000 nm (1 μm) to effectively reduce the likelihood of the laser light LR directly affecting the wiring 60 by, for example, breaking, or indirectly affecting the wiring 60 by, for example, heat damage. More specifically, the light-blocking layer 61R may have a thickness of about 300 to 1000 nm. The light-blocking layer 61R may have a larger thickness than the wiring 60 (about 50 to 200 nm). In this case, the light-blocking layer 61R may more effectively reduce the likelihood of the laser light LR directly affecting the wiring 60 by, for example, breaking, or indirectly affecting the wiring 60 by, for example, heat damage.

Figure 2A:
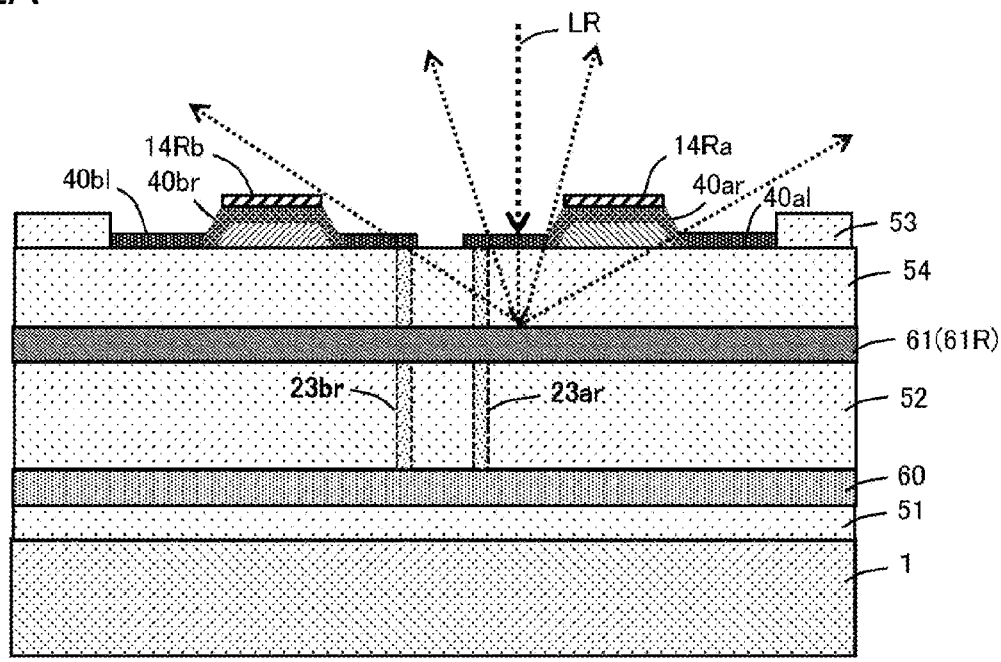
FIG. 2A is a cross-sectional view of a micro-LED board during laser irradiation according to another embodiment of the present disclosure including a light-blocking layer directly below the micro-LED for scattering or reflecting light.
Figure 2B:
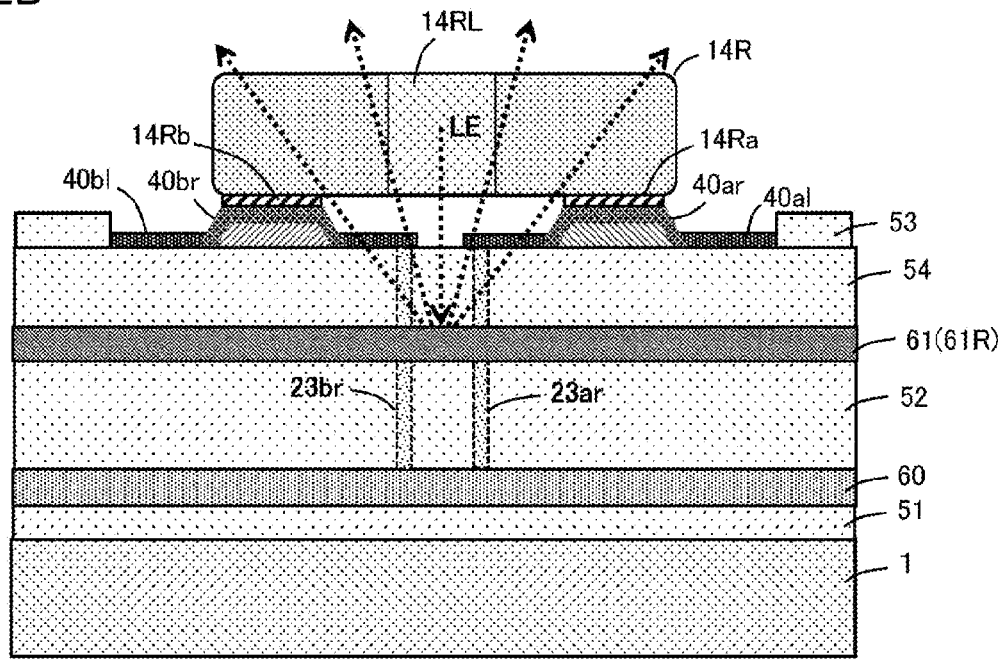
FIG. 2B is a cross-sectional view of the micro-LED board during micro-LED driving according to the other embodiment of the present disclosure including a light-blocking layer directly below the micro-LED for scattering or reflecting light.

As shown in FIGS. 2A and 2B, the micro-LED board in the present embodiment may include the light-blocking layer 61R for scattering or reflecting light. In this structure, as shown in FIG. 2A, the light-blocking layer 61R scatters or reflects laser light LR toward the micro-LED 14R and can block light more effectively. As shown in FIG. 2B, in the display device including the micro-LED board, the light-blocking layer 61R can scatter or reflect light LE emitted from the light-emitting portion 14RL in the micro-LED 14R toward the micro-LED 14R during driving of the micro-LED 14R. This structure can increase the luminance and contrast of a display image.

For example, the light-blocking layer 61R that scatters light may be formed by roughening the surface of its metallic-colored conductor layer including, for example, Ta, W, Ti, Mo, Al, Ag, or Cu. The surface of the light-blocking layer 61R may have an arithmetic mean roughness of 50 μm or less, or more specifically of 1 to 10 μm inclusive. The surface of the light-blocking layer 61R may be roughened by, for example, etching or dry etching, or controlling the film deposition time and temperature in forming the light-blocking layer 61R with a thin film formation method, such as chemical vapor deposition (CVD). Grain structures such as giant single crystal grains and giant polycrystal grains form in the light-blocking layer 61R.

The micro-LED board in the present embodiment may include the light-blocking layer 61R that reflects light. In this structure, the light-blocking layer 61R reflects laser light LR toward the micro-LED 14R and thus can block light more effectively. The display device including the micro-LED board can increase the luminance and contrast of a display image during driving of the micro-LED 14R.

The light-blocking layer 61R that reflects light may be formed by smoothing the surface of its metallic-colored conductor layer including, for example, Ta, W, Ti, Mo, Al, Ag, or Cu. The surface of the light-blocking layer 61R may have an arithmetic mean roughness of 1 μm or less, or more specifically 0.1 μm or less.

Figure 3:
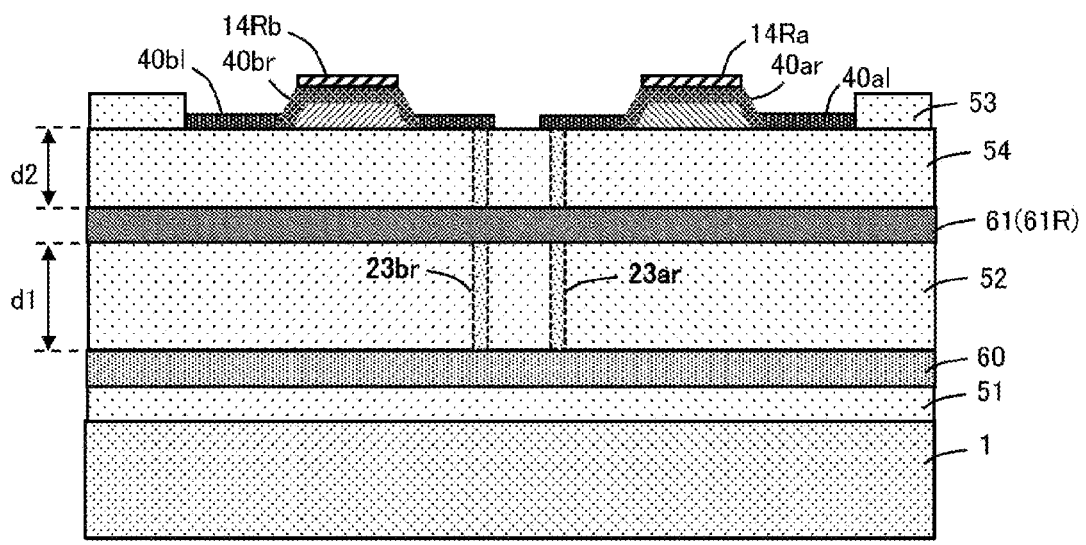
FIG. 3 is a cross-sectional view of a micro-LED board according to another embodiment of the present disclosure including a light-blocking layer directly below the micro-LED.

As shown in FIG. 3, the micro-LED board according to the present embodiment includes a second insulating layer 54 as another insulating layer between the light-blocking layer 61R and the micro-LED 14R. A thickness d1 of the first insulating layer 52 may be larger than a thickness d2 of the second insulating layer. In other words, the light-blocking layer 61R may be located closer to the micro-LED 14R than to the wiring 60. This structure reduces the likelihood of the wiring 60 being affected by heat from irradiation of the laser light LR. This structure can thus more effectively prevent separation at the interface between the wiring 60 and the first insulating layer 52 caused by heat from the laser light LR causing a less flat outermost surface of the substrate 1. In some embodiments, the second insulating layer 54 located closer to the micro-LED 14R than to the light-blocking layer 61R may slightly block or absorb light. The second insulating layer 54 may be slightly dark colored, such as in gray, brown, or navy blue. The light-blocking layer 61R with such a dark color may be formed by mixing dark-colored pigments, dyes, ceramic particles, plastic particles, or metal particles into a resin layer formed from an organic resin such as acrylic resin or polycarbonate. The resin layer may contain pigments, ceramic particles, or metal particles to have high resistance particularly to high-power laser light such as YAG laser light. The light-blocking layer 61R may be an inorganic insulating layer including, for example, $SiO_2$, or $Si_3N_4$, and containing pigments, ceramic particles, or metal particles.

The first insulating layer 52 may be a stack of multiple insulating layers. The second insulating layer 54 may also be a stack of multiple insulating layers.

Figure 4A:
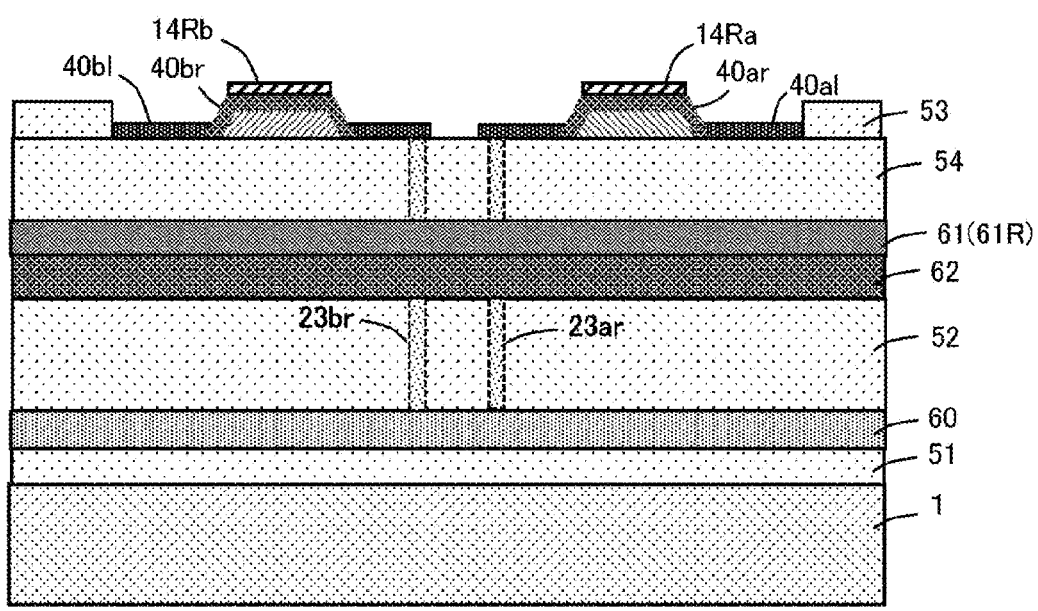
FIG. 4A is a cross-sectional view of a micro-LED board according to another embodiment of the present disclosure including a light-blocking layer and a heat-diffusing layer directly below the micro-LED.
Figure 4B:
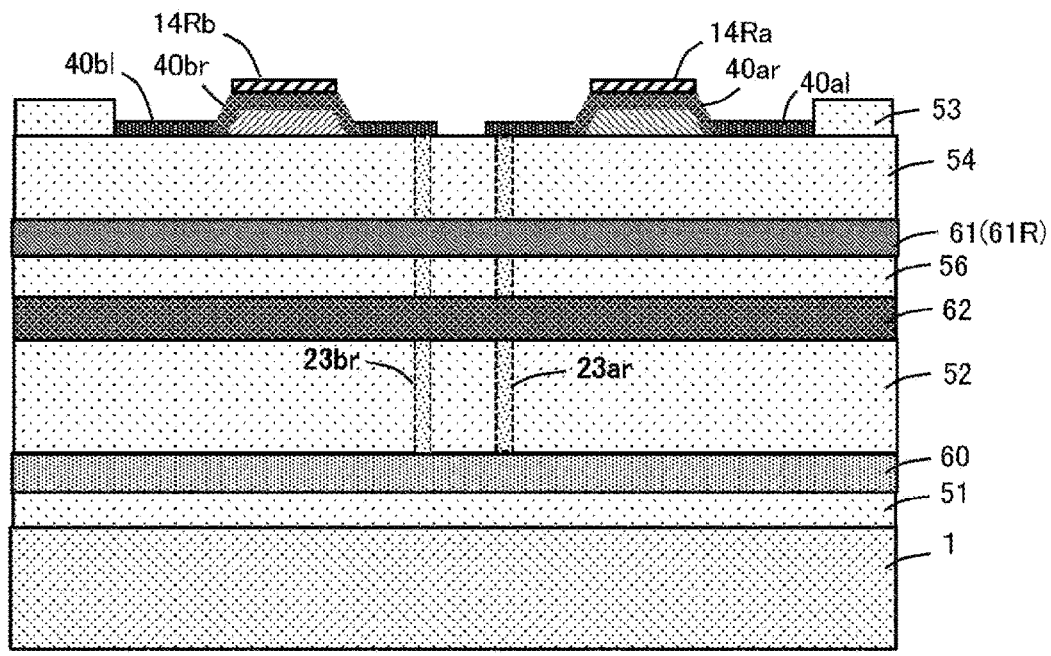
FIG. 4B is a cross-sectional view of a micro-LED board according to another embodiment of the present disclosure with a structure similar to the structure in FIG. 4A, and including an insulating layer between the light-blocking layer and the heat-diffusing layer.

As shown in FIGS. 4A and 4B, the micro-LED board according to the embodiments may include a heat diffusion layer 62 between the first insulating layer 52 and the light-blocking layer 61R. This structure allows the light-blocking layer 61R to block light more effectively, and further reduces the likelihood of the wiring 60 being affected by heat from irradiation of the laser light LR. The heat diffusion layer 62 may include the same material as the light-blocking layer 61R such as Ta, W, Ti, Mo, Al, Ag, and Cu, which has a heat-conductive rate identical to or higher than that of the light-blocking layer 61R.

As shown in FIG. 4B, the micro-LED board according to the embodiments may include a third insulating layer 56 between the light-blocking layer 61R and the heat diffusion layer 62. This structure further reduces the likelihood of the wiring 60 being affected by heat from irradiation of the laser light LR.

The first insulating layer 52, the second insulating layer 54, and the third insulating layer 56 are inorganic insulating layers including, for example, $SiO_2$ or $Si_3N_4$, or organic insulating layers including, for example, acrylic resin or polycarbonate. To have high resistance to laser light LR, the first insulating layer 52, the second insulating layer 54, and the third insulating layer 56 may be inorganic layers including, for example, $SiO_2$ or $Si_3N_4$.

Figure 5:
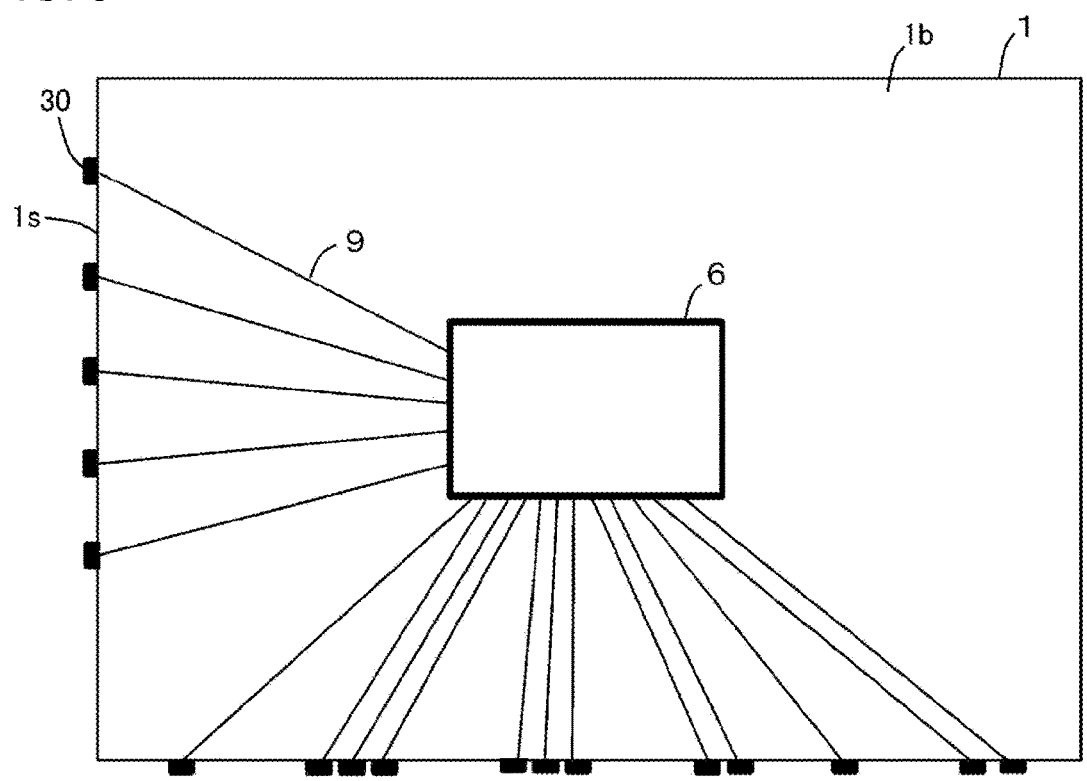
FIG. 5 is a plan view of an opposite surface of a micro-LED board included in a display device according to an embodiment of the present disclosure.

As shown in FIG. 5, the display device according to one or more embodiments includes the micro-LED board according to the above embodiments. The micro-LED board has the mount surface 71 (shown in FIG. 6B) on which the pixel unit 15b including the micro-LED 14R is mountable, an opposite surface 1b (shown in FIG. 6B) opposite to the mount surface 1a, and a side surface 1s (shown in FIG. 6B). As shown in FIG. 1B, the micro-LED 14R is mounted directly on the mount surface 71 of the micro-LED board rather than on the mount surface 1a of the substrate 1. To be more specific, the micro-LED 14R is mounted directly on the second insulating layer 54 which is laminated on the substrate 1. The micro-LED 14R is located on the substrate 1 via at least one insulating layer. The micro-LED board includes the side wiring 30 on the side surface 1s, and the driver 6 on the opposite surface 1b. The multiple pixel units 15b are arranged in a matrix. The micro-LED 14R of each pixel unit 15b is connected to the driver 6 with the side wiring 30. This structure produces the advantageous effects described below. When a micro-LED 14R becomes defective, this structure allows repair using laser light LR without damaging the wiring 60, and thus allows fabrication of a display device having a longer service life. With the driver 6 located on the opposite surface 1b of the substrate 1, the frame 1g (shown in FIGS. 6A and 6B) can be smaller. Thus, a multi-display formed by tiling multiple display devices can have higher image quality with less visible connections between the display devices.

The driver 6 may include driving elements such as ICs and LSI circuits mounted by COG or chip on film (COF), or may be a circuit board on which driving elements are mounted. The driver 6 may also be a thin film circuit including, for example, a TFT that includes a semiconductor layer including low temperature polycrystalline silicon (LTPS) formed directly on the opposite surface 1b of the substrate 1, which may be a glass substrate, by a thin film formation method such as CVD.

The side wiring 30 may be formed from a conductive paste including conductive particles such as Ag, Cu, Al, and stainless steel, an uncured resin component, an alcohol solvent, and water. The conductive paste may be cured by heating, photocuring using ultraviolet ray irradiation, or combination of heating and photocuring. The side wiring 30 may also be formed by a thin film formation method such as plating, vapor deposition, and CVD. The substrate 1 may have a groove on the side surface 1s to receive the side wiring 30. This allows the conductive paste to be easily received in the groove or in an intended portion on the side surface 1s.

The display device according to the present embodiment may form a light-emitting device. The light-emitting device can be used as, for example, a printer head for an image formation device and other devices, an illumination device, a signboard, a notice board, and a traffic light device.

The micro-LED board according to one or more embodiments may be repaired with the method described below. As shown in FIG. 1A, the wiring 60, the first insulating layer 52, and the first micro-LED 14R are located on the substrate 1 in this order from the substrate 1. The wiring 60 overlaps the first micro-LED 14R. The first micro-LED 14R includes the positive electrode 14Ra and the negative electrode 14Rb spaced from each other as viewed in plan. The method includes preparing the micro-LED board including the light-blocking layer 61R between the first insulating layer 52 and the first micro-LED 14R, the light-blocking layer 61R at least partially crossing the wiring 60 directly below the first micro-LED 14R and extending in an area without overlapping the positive electrode 14Ra and the negative electrode 14Rb, removing, when a first micro-LED 14R becomes defective, the first micro-LED 14R from the substrate 1, cutting, using laser light LR, the connection wire 40al connected to the positive electrode 14Ra of the first micro-LED 14R and/or the connection wire 40bl connected to the negative electrode 14Rb at a position of the light-blocking layer 61R overlapping an area of irradiation of laser light LR, and then mounting the second micro-LED 14Rr on the substrate 1. When a first micro-LED 14R becomes defective, this structure allows repair using laser light LR without damaging the wiring 60, and thus allows fabrication of a display device with a longer service life.

The first micro-LED 14R includes, on its surface close to the substrate 1, the positive electrode 14Ra and the negative electrode 14Rb spaced from each other as viewed in plan.

With the above repairing method, the connection wire 40al connected to the positive electrode 14Ra of the first micro-LED 14R and/or the connection wire 40bl connected to the negative electrode 14Rb may be cut using laser light LR at a position between the positive electrode 14Ra and the negative electrode 14Rb. More specifically, when the substrate 1 includes a dark-colored layer such as a black matrix layer serving as a background colored in black or other dark colors for increasing contrast in a portion other than the first micro-LED 14R as viewed in plan, such a dark-colored layer may increase the difficulty in cutting the connection wires 40al and 40bl using laser light LR. The connection wires 40al and 40bl may be cut easily using laser light LR at a position between the positive electrode 14Ra and the negative electrode 14Rb without such difficulty associated with the dark-colored layer described above.

The micro-LED board, the display device, and the repairing method of the micro-LED board according to one or more embodiments of the present disclosure is not limited to the above embodiments and may include design alterations and improvements as appropriate. For example, the substrate 1 may be non-translucent, and may be a glass substrate colored in black, gray, or other colors, or a glass substrate including frosted glass.

The present disclosure may be implemented in the following forms.

A micro-LED board according to one or more embodiments of the present disclosure includes a substrate, wiring, a first insulating layer, a micro-LED, and a light-blocking layer. The wiring, the first insulating layer, and the micro-LED are located on the substrate in an order of the wiring, the first insulating layer, and the micro-LED. The micro-LED overlaps the wiring and includes a positive electrode and a negative electrode spaced from each other in a plan view. The light-blocking layer is located between the first insulating layer and the micro-LED, at least partially crosses a portion of the wiring directly below the micro-LED, and has an area that does not overlap the positive electrode and the negative electrode.

In the micro-LED board according to one or more embodiments of the present disclosure, the light-blocking layer may entirely cover the portion of the wiring directly below the micro-LED.

In the micro-LED board according to one or more embodiments of the present disclosure, the light-blocking layer may scatter light.

In the micro-LED board according to one or more embodiments of the present disclosure, the light-blocking layer may reflect light.

The micro-LED board according to one or more embodiments of the present disclosure may further include a second insulating layer between the light-blocking layer and the micro-LED. A thickness of the first insulating layer may be larger than a thickness of the second insulating layer.

A display device according to one or more embodiments of the present disclosure includes the micro-LED board according to the above embodiments of the present disclosure. The micro-LED board has a mount surface, an opposite surface opposite to the mount surface, and a side surface, the mount surface receiving a plurality of pixel units, each pixel unit of the plurality of pixel units including the micro-LED. The micro-LED board includes side wiring on the side surface, and a driver on the opposite surface. The plurality of pixel units are arranged in a matrix. The micro-LED of each pixel unit is connected to the driver with the side wiring.

The micro-LED board according to one or more embodiments of the present disclosure includes a substrate, wiring, a first insulating layer, a micro-LED, and a light-blocking layer. The wiring, the first insulating layer, and the micro-LED are located on the substrate in an order of the wiring, the first insulating layer, and the micro-LED. The micro-LED overlaps the wiring and includes a positive electrode and a negative electrode spaced from each other in a plan view. The light-blocking layer is located between the first insulating layer and the micro-LED, at least partially crosses a portion of the wiring directly below the micro-LED, and has an area that does not overlap the positive electrode and the negative electrode. This structure produces the effects described below. When a micro-LED has a connection fault or a defect and emits light with an unintended light intensity or fails to emit light, laser light is used to cut the connection wire connected to the positive electrode of the micro-LED and/or the connection wire connected to the negative electrode. This structure can prevent the laser light from reaching the wiring, and thus from accidentally breaking or cutting the wiring. This structure can also prevent separation at the interface between the wiring and the first insulating layer caused by heat from laser irradiation causing a less flat outermost surface of the substrate.

In the micro-LED board according to one or more embodiments of the present disclosure, the light-blocking layer may entirety cover the portion of the wiring directly below the micro-LED. In this structure, the larger light-blocking layer can more effectively prevent laser light from reaching the wiring, and thus from accidentally breaking or cutting the wiring. This structure also can more effectively prevent separation at the interface between the wiring and the first insulating layer caused by heat from laser irradiation causing a less flat outermost surface of the substrate.

In the micro-LED board according to one or more embodiments of the present disclosure, the light-blocking layer that scatters light can scatter laser light toward the micro-LED, and thus can block light more effectively. The display device including the micro-LED board can increase the luminance and contrast of the display image during driving of the micro-LED.

In the micro-LED board according to one or more embodiments of the present disclosure, the light-blocking layer that reflects light can reflect laser light toward the micro-LED, and thus can block light more effectively. The display device including the micro-LED board can increase the luminance and contrast of the display image during driving of the micro-LED.

The micro-LED board according to one or more embodiments of the present disclosure may include a second insulating layer between the light-blocking layer and the micro-LED. A thickness of the first insulating layer may be larger than a thickness of the second insulating layer. This structure reduces the likelihood of the wiring being affected by heat from laser irradiation. This structure can thus more effectively prevent separation at the interface between the wiring and the first insulating layer caused by heat from laser irradiation causing a less flat outermost surface of the substrate.

The display device according to one or more embodiments of the present disclosure includes the micro-LED board according to the above embodiments of the present disclosure. The micro-LED board has a mount surface, an opposite surface opposite to the mount surface, and a side surface, the mount surface receiving a plurality of pixel units, each pixel unit of the plurality of pixel units including the micro-LED. The micro-LED board includes side wiring on the side surface, and a driver on the opposite surface. The plurality of pixel units are arranged in a matrix. The micro-LED of each pixel unit is connected to the driver with the side wiring. This structure produces the effects described below. When a micro-LED becomes defective, this structure allows repair using laser light without damaging the wiring, achieving the display device having a longer service life. With the driver located on the opposite surface of the substrate, the frame can be smaller. Thus, a multi-display formed by tiling multiple display devices can have higher image quality with inconspicuous connections between the display devices.

INDUSTRIAL APPLICABILITY

The display device according to one or more embodiments of the present disclosure can be used in various electronic devices. Such electronic devices include composite and large display devices (multi-displays), automobile route guidance systems (car navigation systems), ship route guidance systems, aircraft route guidance systems, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, head-mounted displays (HMDs), digital display watches, and smartwatches.

The present disclosure may be embodied in various forms without departing from the spirit or the main features of the present disclosure. The embodiments described above are thus merely illustrative in all respects. The scope of the present disclosure is defined not by the description given above but by the claims. Any modifications and alterations contained in the claims fall within the scope of the present disclosure.

REFERENCE SIGNS LIST 1 substrate
1*a* mount surface
1*b* opposite surface
1*s* side surface
6 driver
14B, 14G micro-LED
14R micro-LED (first micro-LED)
14Ra positive electrode
14Rb negative electrode
14RL light-emitting portion
14Rr second micro-LED
15*a*, 15*b* pixel unit
30 side wiring
40*al*, 40*bl* connection wire
40*ar* positive electrode pad
40*br* negative electrode pad
52 insulating layer (first insulating layer)
54 another insulating layer (second insulating layer)
60 wiring
61, 61B, 61G, 61R light-blocking layer

The invention claimed is:

1. A micro-LED board, comprising:
a substrate;
wiring including a positive voltage input line and a negative voltage input line;

a first insulating layer;
a micro-light-emitting diode (micro-LED); and
a light-blocking layer including a metal layer configured to block laser light; wherein
the wiring, the first insulating layer, and the micro-LED are located on the substrate in an order of the wiring, the first insulating layer, and the micro-LED,
the micro-LED includes a positive electrode and a negative electrode spaced from each other in a plan view, the positive electrode and the negative electrode being located on a lower surface of the micro-LED,
the positive electrode is electrically connected the positive voltage input line with a positive electrode pad located on the substrate and a first connection wire,
the negative electrode is electrically connected to the negative voltage input line with a negative electrode pad located on the substrate and a second connection wire,
the light-blocking layer is located between the first insulating layer and the micro-LED, at least partially crosses a portion of the wiring directly below the micro-LED, and has an area that does not overlap the positive electrode and the negative electrode so that the light-blocking layer blocks the laser light not to reach the wiring when the laser light is irradiated to at least one of the first connection wire and the second connection wire for cutting the at least one of the first connection wire and the second connection wire, and
the light-blocking layer is a conductive layer connected to the negative voltage input line.

2. The micro-LED board according to claim 1, wherein the light-blocking layer entirely covers the portion of the wiring directly below the micro-LED.

3. A display device, comprising:
the micro-LED board according to claim 1, wherein
the micro-LED board has a mount surface, an opposite surface opposite to the mount surface, and a side surface, the mount surface receiving a plurality of pixel units, each pixel unit of the plurality of pixel units including the micro-LED, the micro-LED board includes side wiring on the side surface, and a driver on the opposite surface,
the plurality of pixel units are arranged in a matrix, and the micro-LED of each pixel unit is connected to the driver with the side wiring.

4. The micro-LED board according to claim 1, wherein the negative voltage input line serves as a ground potential.

5. The micro-LED board according to claim 1, wherein a thickness of the light-blocking layer is larger than a thickness of the wiring.

6. The micro-LED board according to claim 1, wherein
a heat-diffusion layer is located between the first insulating layer and the light-blocking layer, the heat-diffusion layer having a heat-conductive rate higher than that of the light-blocking layer, and
the heat-diffusion layer is in close contact with the light-blocking layer.

7. The micro-LED board according to claim 1, wherein
a second insulating layer is located between the light-blocking layer and the micro-LED, and
a thickness of the first insulating layer is larger than a thickness of the second insulating layer.

8. A micro-LED board, comprising:
a substrate;
wiring including a positive voltage input line and a negative voltage input line;
a first insulating layer;
a micro-light-emitting diode (micro-LED); and
a light-blocking layer including a metal layer configured to block laser light, wherein
the wiring, the first insulating layer, and the micro-LED are located on the substrate in an order of the wiring, the first insulating layer, and the micro-LED,
the micro-LED includes a positive electrode and a negative electrode spaced from each other in a plan view, the positive electrode and the negative electrode being located on a lower surface of the micro-LED,
the positive electrode is electrically connected the positive voltage input line with a positive electrode pad located on the substrate and a first connection wire,
the negative electrode is electrically connected to the negative voltage input line with a negative electrode pad located on the substrate and a second connection wire,
the light-blocking layer is located between the first insulating layer and the micro-LED, at least partially crosses a portion of the wiring directly below the micro-LED, and has an area that does not overlap the positive electrode and the negative electrode so that the light-blocking layer blocks the laser light not to reach the wiring when the laser light is irradiated to at least one of the first connection wire and the second connection wire for cutting the at least one of the first connection wire and the second connection wire, and
the light-blocking layer is a conductive layer connected to the negative voltage input line,
a heat-diffusion layer is located between the first insulating layer and the light-blocking layer, the heat-diffusion layer having a heat-conductive rate higher than that of the light-blocking layer,
the heat-diffusion layer is in close contact with the light-blocking layer,
a second insulating layer is located between the light-blocking layer and the micro-LED, and
a thickness of the first insulating layer is larger than a thickness of the second insulating layer.

9. The micro-LED board according to claim 8, wherein the light-blocking layer entirely covers the portion of the wiring directly below the micro-LED.

10. A display device, comprising:
the micro-LED board according to claim 8, wherein
the micro-LED board has a mount surface, an opposite surface opposite to the mount surface, and a side surface, the mount surface receiving a plurality of pixel units, each pixel unit of the plurality of pixel units including the micro-LED, the micro-LED board includes side wiring on the side surface, and a driver on the opposite surface,
the plurality of pixel units are arranged in a matrix, and the micro-LED of each pixel unit is connected to the driver with the side wiring.

11. The micro-LED board according to claim 8, wherein the negative voltage input line serves as a ground potential.

12. The micro-LED board according to claim 8, wherein a thickness of the light-blocking layer is larger than a thickness of the wiring.

13. A micro-LED board, comprising:
a substrate;
wiring including a power line;
a first insulating layer;
a light-blocking layer configured to block laser light;

a micro-light-emitting diode (micro-LED) including a positive electrode and a negative electrode spaced from each other in a plan view, the positive electrode and the negative electrode being electrically connected to the power line; and
wherein the wiring, the first insulating layer, the light-blocking layer, and the micro-LED are supported by the substrate in an order of the wiring, the first insulating layer, the light-blocking layer, and the micro-LED,
wherein the light-blocking layer at least partially crosses a portion of the wiring directly below the micro-LED, and has an area that does not overlap the positive electrode and the negative electrode, and
wherein the light-blocking layer is a conductive layer and is connected to the power line.

* * * * *